United States Patent
Jacquet et al.

(10) Patent No.: US 6,535,444 B2
(45) Date of Patent: Mar. 18, 2003

(54) DYNAMIC RANDOM ACCESS MEMORY DEVICE AND PROCESS FOR CONTROLLING A READ ACCESS OF SUCH A MEMORY

(75) Inventors: François Jacquet, Grenoble (FR); Olivier Goducheau, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/879,799

(22) Filed: Jun. 12, 2001

(65) Prior Publication Data
US 2002/0015346 A1 Feb. 7, 2002

(30) Foreign Application Priority Data
Jun. 13, 2000 (FR) .............................. 00 07522

(51) Int. Cl.⁷ .............................................. G11C 7/02
(52) U.S. Cl. ................ 365/210; 365/189.08; 365/203; 365/214
(58) Field of Search .......................... 365/149, 189.08, 365/203, 210, 214, 222

(56) References Cited

U.S. PATENT DOCUMENTS 4,547,868 A   10/1985   Childers et al. ............. 365/203
4,651,306 A * 3/1987   Yanagisawa ................. 365/149
5,889,718 A   3/1999    Kitamoto et al. ............ 365/210

\* cited by examiner

Primary Examiner—Michael S. Lebentritt
Assistant Examiner—VanThu Nguyen
(74) Attorney, Agent, or Firm—Allen, Dyer, Doppelt, Milbrath & Gilchrist, P.A.; Lisa K. Jorgenson

(57) ABSTRACT

A method is for controlling reading of a dynamic random access memory (DRAM) including memory cells connected to a bit line of a memory plane of the DRAM and associated with a main reference cell connected to a reference bit line. The method may include reading and refreshing the contents of the memory cell and pre-charging the bit line, the reference bit line and the main reference cell for a subsequent read access. During reading and refreshing the memory cell, the main reference cell and a secondary reference cell connected to the bit line may be activated and, after having deactivated the two reference cells, they are pre-charged to a final pre-charge voltage. The final pre-charge voltage may be chosen to be less than or greater than (as a function of the NMOS or PMOS technology used, respectively) half the sum of a high-state storage voltage and a low-state storage voltage.

38 Claims, 4 Drawing Sheets

DYNAMIC RANDOM ACCESS MEMORY DEVICE AND PROCESS FOR CONTROLLING A READ ACCESS OF SUCH A MEMORY

FIELD OF THE INVENTION

The invention relates to electronic circuits, and, more particularly, to dynamic random access memories (DRAMs). In particular, the invention relates to the control of the read/rewrite accesses and the pre-charging of reference cells associated with memory cells of a DRAM.

BACKGROUND OF THE INVENTION

The invention applies advantageously, but not limitingly, to so-called "embedded" dynamic memories. That is, the invention relates to memories made jointly with other components by the same technological process and which are intended to be integrated together within an application specific integrated circuit (ASIC), for example.

In static random access memories (SRAMs), information stored therein remains stored indefinitely, i.e., at least as long as the memory remains energized. On the other hand, dynamic memories require a periodic refreshing of the information stored therein due, in particular, to the stray leakage currents which discharge the storage capacitance of each memory cell.

Among dynamic random access memory cells, particular mention is made here of those including one, two or three transistors. Conventionally, dynamic random access memories are arranged in rows and columns of memory cells. Each column includes a metallization commonly referred to as the "bit line" and an immediately adjacent bit line referred to as the reference bit line or "bit line complement." Moreover, means for column-wise pre-charging provide pre-charging of the bit line and the reference bit line of the column before a read access of the memory. The bit line pre-charging and the pre-charging of the reference bit line are generally performed at a voltage equal to Vdd/2, where the supply voltage Vdd represents the storage voltage of a high state (typically a logic "1") and 0 volts (ground) represents the storage voltage of a low state (typically a logic "0").

Most DRAM memories use a row of so-called "reference" cells, also connected to the bit lines and the reference bit lines, to equalize the charges of the bit lines and the reference bit lines. The reference cells also maximize the average amplitude of the signal between 0 and 1. Other pre-charging means are also provided for pre-charging the row of reference cells. The pre-charging of the reference cells is also performed generally at Vdd/2.

During a read access of a memory cell connected to a bit line, this memory cell and the reference cell connected to the reference bit line are selected (i.e., activated). Then the sign of the voltage difference between the bit line and the reference bit line is detected to determine the logic content (0 or 1) of the memory cell. This detection is conventionally performed with the aid of a read/rewrite amplifier connected between the bit line and the reference bit line. This amplifier generally includes two looped-back inverters (forming a bistable flip-flop), each formed by two complementary transistors and controlled by two successive signals read and rewrite (commonly known as "sense" and "restore," respectively).

Upon activation of the restore signal, the datum read from the memory is rewritten, thereby refreshing the contents of this cell. A conventional memory structure of this kind has certain drawbacks. A first drawback lies in the value of the voltage for pre-charging the reference cells. Specifically, by reason of the stray leakage currents which discharge the storage capacitance of each cell storing a logic "1" (i.e., in N-channel metal-oxide semiconductor (NMOS) technology), the voltage of the bit line is less than Vdd when the memory cell is selected. Also, the voltage difference between the bit line and the reference bit line may be reduced thereby when reading the memory cell.

This is especially troublesome if this voltage difference becomes less than the offset voltage of the read/rewrite amplifier since this may lead to erroneous refreshing of the memory cell (i.e., a 1 is rewritten whereas a "0" is read and vice-versa). This problem may arise in a memory which remains inactive (i.e., without read access) for a relatively long time. It may also occur in an embedded DRAM memory for which the process used is geared more towards the speed of propagation of the signals, consequently leading to an increase in the leakage currents.

A second drawback of the structure of the above prior art device lies in the means used for providing the return to the pre-charge value of the reference cells. Specifically, this return is ensured by the use of a DC voltage generator which is common to all the reference cells. However, the design of such a generator is especially difficult due particularly to the considerable charging capacitance (typically 1024 reference cells each having a capacitance of 30 fF), of the large voltage excursion required, and of the high frequencies (e.g., 50–100 MHz for current generations of memory).

The design of such a generator is all the more difficult at low voltages, and the static consumption may be too high to attain the necessary performance. Furthermore, it is especially difficult to distribute the voltage generated across the entire memory by the stray capacitances and miscellaneous resistances. Additionally, the pre-charging operation is greatly dependent upon the data read or written. The invention addresses the above problems.

SUMMARY OF THE INVENTION

An object of the invention is to pre-charge the reference cells of a memory to a pre-charge value which makes reading of the data less sensitive to current leakage.

Another object of the invention is to avoid the use of a DC generator for establishing the pre-charge potential for the reference cells, i.e., for pre-charging these cells.

Yet another object of the invention is to provide a pre-charging mechanism which is effective at low voltages and relatively faster than prior art devices, thus providing an increase in the operating frequency of the memory.

According to the invention, a method is for controlling a read access of a memory cell of a memory plane of a dynamic random access memory. In such a memory, the memory cell is connected to a bit line of the memory plane and associated with a main reference cell connected to a reference bit line. This process includes a phase of reading and refreshing the contents of the memory cell and a phase of pre-charging the bit line, the reference bit line, and the main reference cell with a view to a subsequent read access.

In the course of the phase of reading and refreshing the memory cell, the main reference cell and a secondary reference cell connected to the bit line are activated. After having deactivated the two reference cells, the main reference cell and secondary reference cell are pre-charged to a final pre-charge voltage chosen to be less than or greater than (as a function of the NMOS or PMOS technology used, respectively) half the sum of the high-state storage voltage and the low-state storage voltage. This is done by linking the main reference cell and secondary reference cell to a capacitive line separate from the bit line and from the reference bit line and having a predetermined potential and a predetermined capacitive value.

The invention therefore uses a charge sharing mechanism for pre-charging the reference cells. This charge sharing mechanism is especially effective at low voltage. It is instigated locally, thus allowing an increase in performance (faster pre-charging). This gives rise to an increase in the operating frequency of the memory. It is therefore unnecessary to provide a DC generator to establish the pre-charge potential for the reference cells. As such, an economy of consumption as well as an area savings is achieved.

Moreover, charge sharing using a capacitive line having a predetermined potential and a predetermined capacitive value makes it possible to pre-charge the reference cells to a pre-charge voltage different from half the sum of the high-state storage voltage and the low-state storage voltage (typically different from Vdd/2). Thus, by way of example, the final pre-charge voltage of the reference cells may be equal to one third of the sum of the high-state storage voltage and of the low-state storage voltage (e.g., Vdd/3) for NMOS technology and to two thirds of this sum (i.e., 2Vdd/3) for P-channel MOS (PMOS) technology.

According to one embodiment, the two reference cells may be activated in the course of the reading and refreshing phase to pre-charge the two reference cells with two intermediate pre-charge potentials respectively equal to the high-state and low-state storage voltages. The refreshed memory cell and the two reference cells are then deactivated, before pre-charging the bit line and the reference bit line, and the two reference cells are linked to the capacitive metallization at the predetermined potential.

Stated alternatively, the refreshed memory cell and the reference cells are deselected (isolated from the bit lines). The main and secondary reference cells then remain charged to an opposite state, as are the bit lines. The bit line and the reference bit line are then pre-charged, e.g., to the voltage Vdd/2 by an equalization mechanism. The final pre-charge potential of the reference cells is then obtained by a mechanism for sharing charges between three elements, namely a reference cell in the high state, a reference cell in the low state, and the capacitive line pre-charged to the predetermined potential.

According to another embodiment, the two reference cells may be activated in the course of the reading and refreshing phase to pre-charge the two reference cells with two intermediate potentials respectively equal to the high-state and low-state storage voltages. Then the refreshed memory cell is deactivated while maintaining the two reference cells activated. The bit line and the reference bit line are pre-charged to a pre-charge voltage equal to half the sum of the high-state storage voltage and of the low-state storage voltage. The two reference cells are then deactivated and are linked to the capacitive metallization at the predetermined potential.

Stated otherwise, the refreshed memory cell is deselected but the reference cells remain connected to their respective bit line. The system including the bit lines and the reference cells is then pre-charged, e.g., by an equalization mechanism, to obtain a pre-charging of the bit line and of the reference bit line to the value Vdd/2. This equalization value is then independent of the datum read. The final pre-charge potential of the reference cells is then obtained by a sharing of charge between the reference cells previously pre-charged to Vdd/2, and the capacitive line is pre-charged to the predetermined potential.

Whichever embodiment is used, the main and secondary reference cells are activated in the course of the reading and refreshing phase in such a way to pre-charge them to two opposite states (intermediate potentials). They are then deactivated and linked to the pre-charged capacitive line of the predetermined potential. Moreover, whichever embodiment is used, the value of the final pre-charge potential of the reference cells is independent of the pre-charge voltage and of the capacitive value of the memory cells. It depends only on the high-state and low-state storage voltages.

The invention also relates to a dynamic random access memory (DRAM) device including a memory plane including columns (each of which is formed by a bit line) and a reference bit line. Rows of memory cells are connected to the bit lines and reference bit lines. The DRAM device may also include a controllable read/rewrite amplifier connected to each column of the memory plane, controllable means for column pre-charging connected to each column for pre-charging the bit line and the reference bit line of said column, and pairs of reference cells respectively connected to the bit lines and the reference bit lines of the columns. A main activation metallization of all the reference cells may be connected to the reference bit lines, and a secondary activation metallization of all the reference cells may be connected to the bit lines.

Furthermore, the DRAM device may include controllable means for pre-charging the reference cells. This controllable means may include pairs of linking transistors respectively connected between the pairs of reference cells, a control metallization for all the linking transistors, a capacitive metallization separate from the bit lines and from the reference bit lines and connected to all the respective common nodes of the pairs of linking transistors, and means for bringing the capacitive metallization to a predetermined potential. The means for pre-charging the reference cells may pre-charge (following a phase of reading and refreshing the contents of the memory cells of a row of the memory plane) the two reference cells of each pair to a final pre-charge voltage. The final pre-charge voltage may be chosen to be less than or greater than (as a function of the NMOS or PMOS technology used) half the sum of the high-state storage voltage and of the low-state storage voltage.

Moreover, the DRAM device may also include control means for controlling the read/rewrite amplifier, the means for pre-charging columns, and the means for pre-charging the reference cells. According to the invention, the control means are able to activate the main reference cell and the secondary reference cell of each pair during the phase of reading and refreshing the memory cells to pre-charge the reference cells respectively to two predetermined intermediate potentials. The control means are then able to deactivate the two reference cells and control the linking transistors to turn them on and to thus link the two reference cells of each pair to the capacitive metallization which has the predetermined potential. This is done to pre-charge the two reference cells to the final pre-charge voltage.

Additionally, the potential of the capacitive metallization may be zero. The means for pre-charging the reference cells may then include an auxiliary transistor controllable by the control means and able to link this capacitive metallization to ground. The capacitive metallization may include a metallization and a predetermined number of identical capacitors each having a capacitive value equal to that of the memory cell and all connected in parallel between the metallization and ground. When one wishes to obtain a pre-charge voltage for the reference cells equal to Vdd/3, for example, one may advantageously choose a number of identical capacitors equal to the number of columns.

BRIEF DESCRIPTION OF THE DRAWINGS

Other advantages and characteristics of the invention will become apparent upon examination of the detailed description of embodiments thereof, given by way of non-limitative example, and the appended drawings, in which.

DETAILED DESCRIPTION OF THE PREFERRED EMBODIMENTS

Figure 1:
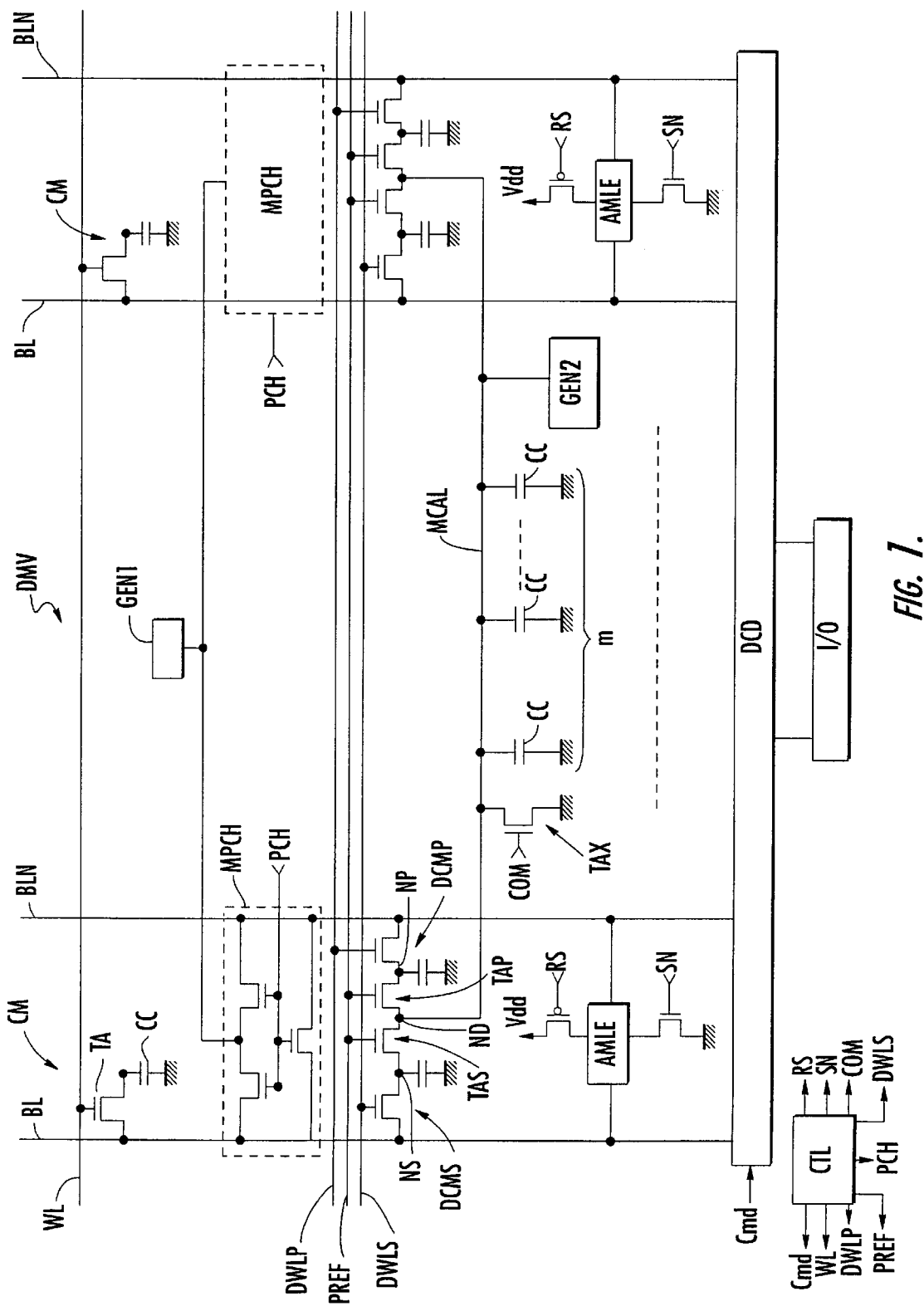
FIG. 1 is a schematic diagram of a dynamic random access memory according to the invention.

Turning now to FIG. 1, a random access memory device DMV according to the invention is now described. The random access memory device DMV includes a memory plane including memory cells CM arranged in rows and columns. Each memory cell CM is a memory cell including an access transistor TA and a storage capacitor CC. Of course, the invention is not limited to this type of dynamic random access memory cell.

All the cells CM of one and the same row can be simultaneously activated by an activation signal WL propagating over a word line. Specifically, the gates of the transistors TA of these memory cells CM are connected to the word line WL. Moreover, all the cells of the row are respectively linked to column metallizations BL or bit line metallizations.

Furthermore, an immediately adjacent bit line BLN (commonly referred to by the person skilled in the art as the reference bit line or "bit line complement") is associated with each bit line BL. The bit lines BLN make it possible to connect other rows of memory cells in quincunx fashion. Of course, for a memory cell connected to a bit line BLN, the bit line BL then acts as reference bit line. Each column of the memory plane is therefore formed by a bit line BL and of a reference bit line BLN.

At the bottom of each column, there is provided a column decoder DCD of conventional structure known to those of skill in the art that is controlled by a column decoding signal Cmd. This column decoder DCD makes it possible to select one of the columns of the memory plane to allow the delivery of the content of the memory cell placed at the intersection of the selected column and selected row to the output interface I/O of the random access memory device DMV.

The random access memory device DMV further includes controllable means MPCH for column pre-charging, which may also be of a conventional structure known in the art. The means MPCH are, for example, formed by three transistors controlled by the signal MPCH. The pre-charging means are illustratively shown in FIG. 1 as means of "clamping" the bit line BL and the reference bit line BLN of a column. The means make it possible during clamping (i.e., when the three transistors are on) to equalize the potential of the bit line and of the reference bit line.

The pre-charging means MPCH of the random access memory device DMV may be connected to a generator GEN1, the function of which will be discussed in greater detail below. The random access memory device DMV moreover comprises, in a conventional manner, a controllable read/rewrite amplifier AMLE connected to each column of the memory plane. More precisely, this read/rewrite amplifier is connected between the bit line BL and the reference bit line BLN of the column. The structure of such a read/rewrite amplifier is disclosed in French patent application No. 2,768,847. This read/rewrite amplifier is typically controlled by two successive signals, read SN and rewrite RS, commonly referred to respectively as "sense" and "restore."

In addition to the means just described, the random access memory device DMV according to the invention may include a pair of reference cells connected to the bit line and the reference bit line of each column. More precisely, the pair of reference cells comprises a main reference cell DCMP connected to the reference bit line BLN. The pair of reference cells also includes a secondary reference cell DCMS connected to the bit line BL. The two reference cells are also connected together at a node ND.

For a memory cell CM of the memory plane connected to bit line BL, the term "main" is used to designate the reference cell connected to the reference bit line, and the term "secondary" is used to designate the reference cell connected to the bit line. Of course, for a memory cell CM connected to the reference bit line BLN, the main reference cell associated with this memory cell would be the cell DCMS and the secondary reference cell would be the cell DCMP.

Each secondary reference cell DCMS includes an access transistor whose gate is connected to an activation metallization (i.e., the secondary activation metallization DWLS), which is common to the entire memory plane. Likewise, each main reference cell DCMP includes an access transistor whose gate is connected to an activation metallization (i.e., the main activation metallization DWLP), also common to the entire memory plane.

The access transistor of each secondary reference DCMS of a column is also connected to the bit line BL. Also, the access transistor of the main reference cell DCMP of a column is connected to the reference bit line BLN. The third electrode of the access transistor of a secondary reference cell DCMS, namely the node NS, is connected to ground by a storage capacitor CC. Likewise, the third electrode of the access transistor of the main reference cell DCMP is also connected to ground by another storage capacitor CC. In fact, the reference cells are structurally similar to the cells CM of the memory plane.

The random access memory device DMV moreover comprises controllable means of pre-charging the reference cells DCMS and DCMP. The controllable means of pre-charging the reference cells include pairs of linking transistors TAS and TAP, respectively connected between the pairs of reference cells DCMS and DCMP. More precisely, the linking transistor TAS is connected to the node NS of the reference cell DCMS while the linking transistor TAP is connected to the node NP of the reference cell DCMP. The two linking transistors are also connected to a common node ND.

The means for pre-charging the reference cells also include a metallization PREF for controlling all the linking transistors. Stated otherwise, the gates of all the linking transistors TAS and TAP are all connected to the metallization PREF. The controllable means for pre-charging the reference cells may also include a capacitive metallization. This capacitive metallization is separate from the bit lines and from the reference bit lines and is connected to all the respective common nodes ND of the pairs of linking transistors TAS and TAP.

More particularly, the capacitive metallization is illustratively shown as a metallization MCAL linking all the nodes ND, as well as a predetermined number m of identical capacitors CC each having a capacitive value equal to that of the memory cell CM. The identical capacitors CC are all connected in parallel between the metallization MCAL and ground.

The controllable means for pre-charging the reference cells also comprise means for bringing the capacitive metallization to a predetermined potential. For example, the means for bringing the capacitive metallization to a predetermined potential may include an auxiliary transistor TAX, controllable on its gate by a control signal COM, and able to link the capacitive metallization to ground. Stated otherwise, ground is the predetermined potential to which the capacitive metallization will be brought during the pre-charging of the reference cells, as will be seen in greater detail below.

The various metallizations WL, DWLP, PREF, DWLS convey activation signals which for simplification are designated by the same references as those assigned to the metallizations. These various activation signals, as well as the control signals SN, RS, COM, Cmd are delivered by control means CTL. The control means CTL may conventionally be embodied in logic gates, for example.

Figure 2:
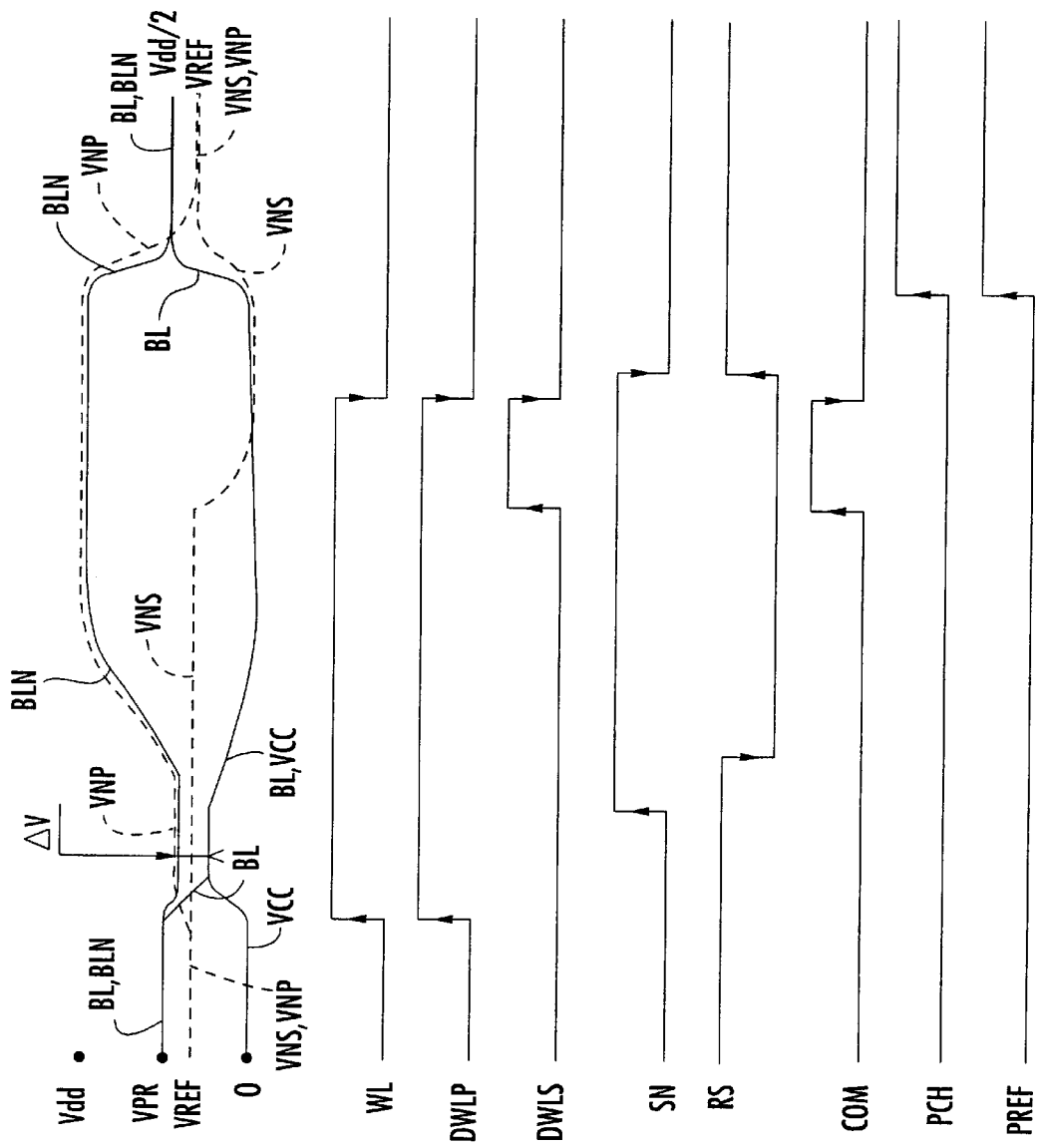
FIG. 2 is a timing diagram illustrating a first process according to the invention where a logic 0 is stored in a memory cell of the memory.

Operation of the random access memory device, and more particularly the mechanism for pre-charging the reference cells, will now be described in greater detail with reference to FIGS. 2–4. With reference to FIG. 2, it is assumed that the supply voltage is equal to Vdd and that the memory cell CM stores a logic 0. It is also assumed that during read access of the memory cell CM the bit line BL and the bit line BLN have been previously pre-charged to a pre-charge voltage VPR, which may be the voltage Vdd/2, for example.

Additionally, it is further assumed that the secondary and main reference cells have been pre-charged to a pre-charge voltage VREF. Stated otherwise, the voltages VNS and VNP at the nodes NS and NP are equal to the voltage VREF. The manner in which these various pre-charge voltages are obtained will be seen in greater detail hereinbelow. Yet, it should be noted at the outset that the pre-charge voltage VREF of the reference cells is different from the voltage Vdd/2. For example, the voltage VREF may be equal to Vdd/3. Moreover, since the memory cell CM stores a logic 0, the voltage VCC at the common node between the storage capacitor CC and the access transistor TA is zero.

To read the memory cell, the row to which the memory cell belongs is selected. That is, the signal WL is activated which sends it to the logic 1 state and turns on the transistor TA. Simultaneously, the main reference cell DCMP associated with the memory cell CM is activated by activating the control signal DWLP. At this point, the reference cell DCMS is not activated (signal DWLS at 0). The control signals COM, PCH, PREF, SN and RS are also not activated. It should be noted here that the signal RS is inactive at 1, and active at 0 since it controls a PMOS transistor.

Upon activation of the signal WL and the signal DWLP, the memory cell CM is then connected to the bit line BL, which was brought to the potential VPR. Also, the main reference cell DCMP is linked to the reference bit line BLN, which was also brought to the potential VPR. The voltage of the bit line BL drops while the voltage VCC increases, where these two voltages become equalized at an intermediate value. Likewise, the voltage of the reference bit line BLN decreases while the voltage VNP rises, where these two voltages become equalized at another intermediate value. The voltage VNS remains equal to the pre-charge voltage VREF.

The pre-charge voltage VREF and the pre-charge voltage VPR are chosen so that the voltage discrepancy ΔV between the voltage VNP and the voltage VL of the bit line BL is greater than the offset voltage of the read/rewrite amplifier AMLE. The signal SN is then activated which allows the amplification of the voltage difference ΔV and the reading of the stored data. Next, in conventional manner, the signal RS is activated which causes the voltage VNP and the voltage of the reference bit line BLN to climb toward the potential Vdd. At the same time, the potential of the bit line BL and the voltage VCC drop toward ground. The datum read is then rewritten to the memory cell CM.

In the course of this read/rewrite phase (i.e., before the deactivation of the signals SN and RS), the secondary reference cell is activated by activating the activation signal DWLS. The result of the signal DWLS rising to 1 is that the secondary reference cell is connected to the bit line BL and, consequently, the voltage VNS to drop toward ground. At this instant, the two reference cells have been pre-charged to two so-called intermediate potentials, namely the potential Vdd and the zero potential.

On completion of this read/rewrite phase, the memory cell CM, the main reference cell and the secondary reference cell are deactivated. This is done by causing the corresponding activation logic signals to fall back to 0. Next, a shortly after this deactivation, the signals SN and RS are deactivated. At this point, the reference cells are electrically isolated from the bit line and from the reference bit line of the column.

To prepare the memory plane for a subsequent read request, the bit line, the reference bit line, and reference cells will now be pre-charged again. In this regard, the pre-charging of the bit lines is performed by activating the pre-charge control signal PCH. This has the effect of turning on the three transistors of pre-charging means MPCH and therefore clamping the bit line and the reference bit line. Consequently, the voltages of the bit line and the reference bit line equalize at the voltage Vdd/2.

It should be noted here that the symmetrical nature of the reference cells substantially guarantees perfect equality of the capacitances on either side, i.e., of the capacitances seen by the bit line and the reference bit line. It is this equality which leads to equalization at Vdd/2. It should also be noted here that this equalization value is independent of the datum read. Further, if the voltage VPR is different from Vdd/2, it will be necessary to provide a voltage generator connected to the bit lines and capable of generating the voltage excursion between Vdd/2 and VPR.

For the above embodiment, the reference cells will be pre-charged simultaneously with the pre-charging of the bit lines by activating the pre-charge signal PREF. However, before activating this pre-charge signal PREF (which will turn on the two linking transistors TAS and TAP), the control signal COM for the auxiliary transistor TAX has been activated. This has the effect of discharging the capacitors CC of the capacitive metallization and consequently bringing the node ND to a zero voltage. It should be noted here that the instant of activation of the signal COM is of no importance provided that it is performed before the activation of the signal PREF. Upon activation of the signal PREF, the two voltages VNS and VNP then equalize the voltage VREF.

Using the equation for the sharing of charges at the node ND upon activation of the signal PREF, a ratio VREF/Vdd= 1/(2+m/nc) is obtained. In this formula, m is the number of capacitors CC connected to the metallization MCAL and nc is the number of columns. It may therefore be seen that if the ratio m/nc is equal to 1 (i.e., if there are as many capacitors CC as columns of the memory plane), then the voltage VREF is equal to Vdd/3.

Figure 3:
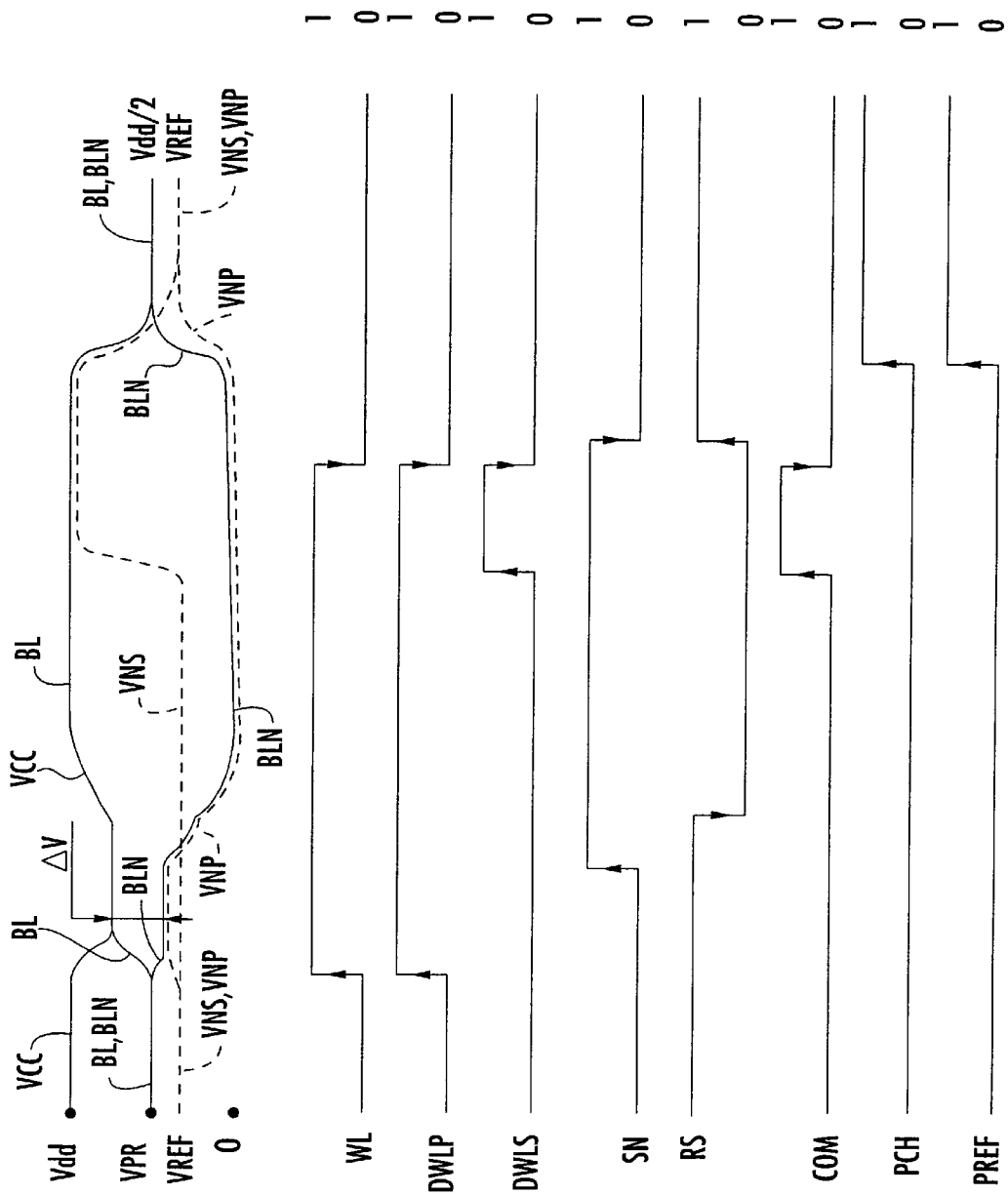
FIG. 3 is a timing diagram illustrating the first process according to the invention where a logic "1" is stored in the memory cell.

FIG. 3 illustrates a timing diagram similar to that of FIG. 2 but that is applicable to the case where the memory cell CM stores a logic "1." Only the differences between the timing diagram of FIG. 3 and that of FIG. 2 will be described here. Before the activation of the signal WL (i.e., before selection of the memory cell), the voltage VCC is equal to the voltage Vdd since the cell contains a logic 1. Upon activation of the signal WL and the signal DWLP, the voltage VCC and the voltage of the bit line BL equalize. Likewise, the voltage VNP and the voltage of the reference bit line BLN equalize.

It should be noted here that because the pre-charge voltage VREF of the reference cells is less than the value Vdd/2 (e.g., Vdd/3), this has an advantage where the memory exhibits non-negligible leakage currents. Specifically, with such leakage currents, the voltage VCC is no longer equal to Vdd at the moment of selection of the memory cell. Instead, it is equal to a voltage below Vdd due to the leakage currents. As a result, the equalization voltage between the voltage VCC and the voltage of the bit line BL will consequently be smaller. Also, if the voltage VREF were equal to Vdd/2, the voltage discrepancy $\Delta V$ after activation of the signal WL and the signal DWLP would be lower than where the initial voltage VREF is less than Vdd/2.

The invention therefore makes it possible, with a suitable choice of VREF, to take into account the leakage currents to obtain a sufficient voltage difference $\Delta V$ greater than the offset voltage of the read/rewrite amplifier. Upon activation of the signal SN and the signal RS, now the bit line BL and the voltage VCC rise to Vdd, although the voltage VNP and the voltage of the reference bit line BLN drop to ground.

Upon activation of the signal DWLS, the voltage VNS now climbs to Vdd. At this instant, the voltages VNS and VNP of the two reference cells are pre-charged to the two intermediate potentials respectively equal to Vdd and 0. Yet, unlike the case of FIG. 2, it is the secondary reference cell which stores a high state while the reference of the main reference cell stores a low state. The remainder of the process is as described with reference to FIG. 2.

Figure 4:
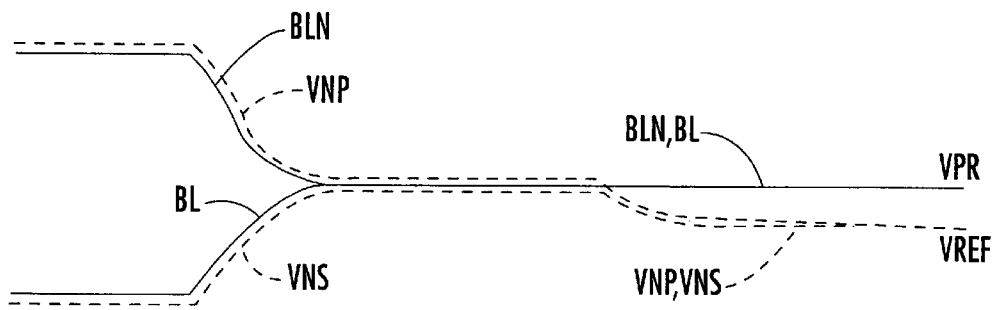
FIG. 4 is a timing diagram illustrating a second process according to the invention.
Figure 4:
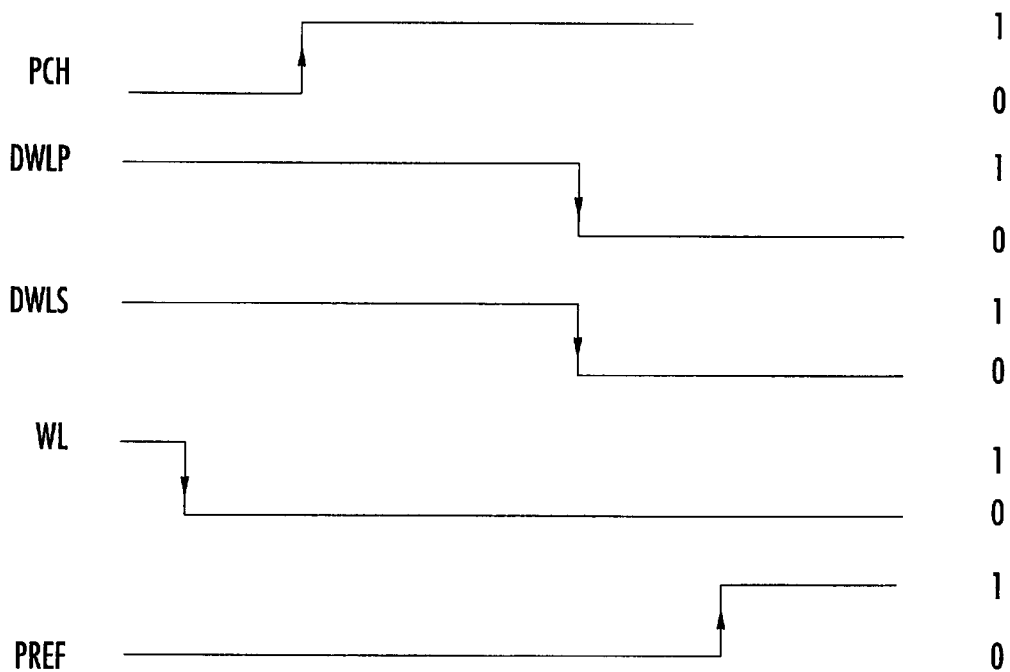

Reference will now be made to FIG. 4 to describe another implementation of the process according to the invention in which the refreshed memory cell is deselected but the reference cells remain connected to their respective bit lines. The partial timing diagram of FIG. 4 illustrates the situation after activation of the signal DWLS, i.e., when the two reference cells have been pre-charged to their respectively intermediate potentials Vdd and 0.

The memory cell is then deselected by dropping the signal WL to 0. Next, the bit line and the reference bit line are pre-charged by activating the signal PCH, thereby causing equalization of some of the voltages of the bit line BL and the bit line BLN and also of the voltages VNS and VNP. This is because the reference cells remain connected to their respective bit lines. The substantially perfect equality of the capacitances seen by the bit line and the reference bit line substantially guarantees the perfect equalization to the voltage Vdd/2.

Next, the reference cells are deselected by dropping the signals DWLP and DWLS to 0. Next, pre-charging of the reference cells is activated by activating the signal PREF. The mechanism for sharing charge between the two reference cells previously charged to Vdd/2 and the capacitive metallization brought to ground then occurs. This causes the voltages VNP and VNS to drop to the pre-charge voltage VREF of the reference cells.

The above description is given by way of example with reference to memory cells and reference cells made with NMOS technology (i.e., with NMOS transistors made, for example, in a P substrate linked to ground (or even negatively biased)). Of course, the above equally applies to memory cells and reference cells made with PMOS technology, i.e., with PMOS transistors made in an N substrate linked to the supply voltage Vdd (or even biased to a voltage greater than Vdd). Those skilled in the art will be able to make the necessary adjustments based upon the above description using NMOS technology.

More particularly, in PMOS technology, the problem of current leakage now brings about a rise in the initially grounded low-state storage voltage. As a result, for PMOS technology, one will choose a pre-charge voltage VREF greater than half the sum of the high-state voltage (e.g., Vdd) and of the low-state voltage (e.g., ground). For example, a voltage equal to $\frac{2}{3}$ of Vdd may be chosen. For a $0.18\mu$ technology (Vdd=1.8 volts), the values Vdd/3 and 2Vdd/3 chosen by way of example are entirely suitable since generally the offset voltages of read/rewrite amplifiers are on the order of 50 mVolts.

Referring once again to FIG. 1, two DC voltage generators GEN1 and GEN2 are also illustrated. The two generators GEN1 and GEN2, respectively connected to the pre-charge means MPCH and to the metallization MCAL, serve to maintain the respective pre-charge voltages of the bit lines and of the reference cells (i.e., the voltages VPR and VREF) in case of prolonged non-use of the memories, for example. This is done to limit the effects of current leakage. This being so, the generators GEN1 and GEN2 (and in particular the generator GEN2) may be extremely simple generators exhibiting no dynamic constraint. Thus, the generator GEN2 has nothing to do with the generator used in the prior art for pre-charging the main reference cell.

That which is claimed is:

1. A method for controlling a read access of a memory cell of a dynamic random access memory (DRAM), the memory cell being connected to a bit line and associated with a main reference cell connected to a reference bit line, the method comprising:

activating the main reference cell and a secondary reference cell, the secondary reference cell being connected to the bit line; and after deactivating the main reference cell and the secondary reference cell, pre-charging the main reference cell and the secondary reference cell to a final pre-charge voltage between a high-state storage voltage and a low-state storage voltage by connecting the main reference cell and the secondary reference cell to a capacitive line separate from the bit line and from the reference bit line and having a predetermined voltage and a predetermined capacitive value.

2. The method according to claim 1 wherein the final pre-charge voltage is different than half a sum of the high-state storage voltage and the low-state storage voltage.

3. The method according to claim 1 wherein the memory cell comprises N-channel metal oxide semiconductor (NMOS) devices; and wherein the final pre-charge voltage is less than about half a sum of the high-state storage voltage and the low-state storage voltage.

4. The method according to claim 3 wherein the final pre-charge voltage is equal to about one third of the sum of the high-state storage voltage and the low-state storage voltage.

5. The method according to claim 1 wherein the memory cell comprises P-channel metal oxide semiconductor (PMOS) devices; and wherein the final pre-charge voltage is greater than about half a sum of the high-state storage voltage and the low-state storage voltage.

6. The method according to claim 5 wherein the final pre-charge voltage is equal to about two thirds of the sum of the high-state storage voltage and the low-state storage voltage.

7. The method according to claim 1 wherein activating the main reference cell and the secondary reference cell comprises pre-charging the main reference cell and the secondary reference cell with two intermediate pre-charge voltages respectively equal to the high-state storage voltage and the low-state storage voltage.

8. The method according to claim 1 wherein the predetermined voltage of the capacitive line is zero; and further comprising connecting the capacitive line to ground before connecting the main reference cell and the secondary reference cell to the capacitive line.

9. The method according to claim 1 wherein the capacitive line comprises a predetermined number of substantially identical capacitors each having a capacitive value equal to a capacitive value of the memory cell.

10. A method for controlling a read access of a memory cell of a dynamic random access memory (DRAM), the memory cell being connected to a bit line and associated with a main reference cell connected to a reference bit line, the method comprising:
    activating the main reference cell and a secondary reference cell, the secondary reference cell being connected to the bit line;
    pre-charging the bit line and the reference bit line; and
    after deactivating the main reference cell and the secondary reference cell, pre-charging the main reference cell and the secondary reference cell to a final pre-charge voltage between a high-state storage voltage and a low-state storage voltage by connecting the main reference cell and the secondary reference cell to a capacitive line separate from the bit line and from the reference bit line and having a predetermined voltage and a predetermined capacitive value.

11. The method according to claim 10 wherein the final pre-charge voltage is different than half a sum of the high-state storage voltage and the low-state storage voltage.

12. The method according to claim 10 wherein the memory cell comprises N-channel metal oxide semiconductor (NMOS) devices; and wherein the final pre-charge voltage is less than about half a sum of the high-state storage voltage and the low-state storage voltage.

13. The method according to claim 12 wherein the final pre-charge voltage is equal to about one third of the sum of the high-state storage voltage and the low-state storage voltage.

14. The method according to claim 10 wherein the memory cell comprises P-channel metal oxide semiconductor (PMOS) devices; and wherein the final pre-charge voltage is greater than about half a sum of the high-state storage voltage and the low-state storage voltage.

15. The method according to claim 14 wherein the final pre-charge voltage is equal to about two thirds of the sum of the high-state storage voltage and the low-state storage voltage.

16. The method according to claim 10 wherein activating the main reference cell and the secondary reference cell comprises pre-charging the main reference cell and the secondary reference cell with two intermediate pre-charge voltages respectively equal to the high-state storage voltage and the low-state storage voltage.

17. A dynamic random access memory (DRAM) comprising:
    a plurality of memory cells arranged in rows and columns, and bit lines and reference bit lines connected thereto;
    a controllable read/rewrite amplifier connected to each column;
    a pair of reference cells respectively connected to the bit line and the reference bit line of each column;
    first control means for pre-charging said reference cells comprising
        a pair of linking transistors respectively connected between each pair of reference cells,
        a capacitive line separate from the bit lines and from the reference bit lines and connected to respective common nodes of said linking transistors, and
        pre-charging means for bringing the capacitive line to a predetermined voltage, said pre-charging means pre-charging each-pair of reference cells to a final pre-charge voltage between a high-state storage voltage and a low-state storage voltage following reading and refreshing of contents of said memory cells of a row of said memory plane; and
    second control means for controlling said controllable read/rewrite amplifier and said first control means for pre-charging said reference cells.

18. The DRAM according to claim 17 wherein the final pre-charge voltage is different than half a sum of the high-state storage voltage and the low-state storage voltage.

19. The DRAM according to claim 17 wherein said memory cells comprise N-channel metal oxide semiconductor (NMOS) devices; and wherein the final pre-charge voltage is less than about half a sum of the high-state storage voltage and the low-state storage voltage.

20. The DRAM according to claim 19 wherein the final pre-charge voltage is equal to about one third of the sum of the high-state storage voltage and the low-state storage voltage.

21. The DRAM according to claim 17 wherein said memory cells comprise P-channel metal oxide semiconductor (NMOS) devices; and wherein the final pre-charge voltage is greater than about half a sum of the high-state storage voltage and the low-state storage voltage.

22. The DRAM according to claim 21 wherein the final pre-charge voltage is equal to about two thirds of the sum of the high-state storage voltage and the low-state storage voltage.

23. The DRAM according to claim 17 wherein each pair of reference cells comprises a main reference cell and a secondary reference cell; and wherein said second control means activate said main reference cell and said secondary reference cell of each pair of reference cells during reading and refreshing of said memory cells to pre-charge said main reference cell and said secondary reference cell to respective predetermined intermediate voltages.

24. The DRAM according to claim 23 wherein said second control means further deactivate said main reference cell and said secondary reference cell and activate each pair of linking transistors to link said main reference cell and said secondary reference cell of each pair of reference cells to said capacitive line having the predetermined voltage to pre-charge said main reference cell and said secondary reference cell to the final pre-charge voltage.

25. The DRAM according to claim 17 wherein the predetermined voltage of said capacitive line is zero; and wherein said second control means comprise an auxiliary transistor for connecting said capacitive line to ground.

26. The DRAM according to claim 17 wherein said capacitive line comprises a metallization and a predetermined number of substantially identical capacitors each having a capacitive value equal to a capacitive value of one of said memory cells and being connected in parallel between said metallization and ground.

27. The DRAM according to claim 17 further comprising:
a main activation line connected to the reference bit lines;
a secondary activation line connected to the bit lines; and
a control line connected to the linking transistors.

28. The DRAM according to claim 17 further comprising a third control means connected to each column for pre-charging the bit line and the reference bit line thereof.

29. A dynamic random access memory (DRAM) comprising:
a plurality of memory cells arranged in rows and columns, and bit lines and reference bit lines connected thereto;
a controllable read/rewrite amplifier connected to each column;
a pair of reference cells respectively connected to the bit line and the reference bit line of each column;
a pre-charging circuit for pre-charging said reference cells comprising
  a pair of linking transistors respectively connected between each pair of reference cells,
  a capacitive line separate from the bit lines and from the reference bit lines and connected to respective common nodes of said linking transistors, and
  a pre-charger for bringing the capacitive line to a predetermined voltage, said pre-charger pre-charging each pair of reference cells to a final pre-charge voltage between a high-state storage voltage and a low-state storage voltage following reading and refreshing of contents of said memory cells of a row of said memory plane; and
a controller for controlling said controllable read/rewrite amplifier and said pre-charging circuit.

30. The DRAM according to claim 29 wherein the final pre-charge voltage is different than half a sum of the high-state storage voltage and the low-state storage voltage.

31. The DRAM according to claim 29 wherein said memory cells comprise N-channel metal oxide semiconductor (NMOS) devices; and wherein the final pre-charge voltage is less than about half a sum of the high-state storage voltage and the low-state storage voltage.

32. The DRAM according to claim 31 wherein the final pre-charge voltage is equal to about one third of the sum of the high-state storage voltage and the low-state storage voltage.

33. The DRAM according to claim 29 wherein said memory cells comprise P-channel metal oxide semiconductor (NMOS) devices; and wherein the final pre-charge voltage is greater than about half a sum of the high-state storage voltage and the low-state storage voltage.

34. The DRAM according to claim 33 wherein the final pre-charge voltage is equal to about two thirds of the sum of the high-state storage voltage and the low-state storage voltage.

35. The DRAM according to claim 29 wherein each pair of reference cells comprises a main reference cell and a secondary reference cell; and wherein said controller activates said main reference cell and said secondary reference cell of each pair of reference cells during reading and refreshing of said memory cells to pre-charge said main reference cell and said secondary reference cell to respective predetermined intermediate voltages.

36. The DRAM according to claim 35 wherein said controller further deactivates said main reference cell and said secondary reference cell and activates each pair of linking transistors to link said main reference cell and said secondary reference cell of each pair of reference cells to said capacitive line having the predetermined voltage to pre-charge the main reference cell and the secondary reference cell to the final pre-charge voltage.

37. The DRAM according to claim 29 wherein the predetermined voltage of said capacitive line is zero; and wherein said controller comprises an auxiliary transistor for connecting said capacitive line to ground.

38. The DRAM according to claim 29 wherein said capacitive line comprises a metallization and a predetermined number of substantially identical capacitors each having a capacitive value equal to a capacitive value of one of said memory cells and being connected in parallel between said metallization and ground.

* * * * *